United States Patent [19]

Taketoshi et al.

[11] 4,392,452
[45] Jul. 12, 1983

[54] EVAPORATION DEVICE

[75] Inventors: Kazuhisa Taketoshi, Sagamihara; Chihaya Ogusu, Tokyo, both of Japan

[73] Assignee: Nippon Hoso Kyokai, Tokyo, Japan

[21] Appl. No.: 372,389

[22] Filed: Apr. 27, 1982

Related U.S. Application Data

[62] Division of Ser. No. 213,016, Dec. 4, 1980, Pat. No. 4,352,834.

[30] Foreign Application Priority Data

Dec. 26, 1979 [JP] Japan ................ 54-168076

[51] Int. Cl.$^3$ ............................................. C23C 13/12
[52] U.S. Cl. .................................. 118/723; 118/724; 118/725; 118/726; 118/50.1; 422/168
[58] Field of Search ............ 118/723, 724, 726, 50.1, 118/725, 722, 733, 719; 427/38, 39; 422/168

[56] References Cited

U.S. PATENT DOCUMENTS

| | | | |
|---|---|---|---|
| 3,847,114 | 11/1974 | Kiyozumi | 118/726 |
| 3,974,059 | 8/1976 | Murayama | 118/726 X |
| 3,980,044 | 9/1976 | Zollinger | 118/723 |
| 4,178,877 | 12/1979 | Kudo | 118/728 |
| 4,310,614 | 1/1982 | Connell et al. | 118/723 X |

FOREIGN PATENT DOCUMENTS

| 135216 | 4/1979 | Fed. Rep. of Germany | 118/724 |
|---|---|---|---|
| 52-63125 | 5/1977 | Japan | 427/38 |

Primary Examiner—John D. Smith
Assistant Examiner—Bernard F. Plantz
Attorney, Agent, or Firm—Parkhurst & Oliff

[57] ABSTRACT

In a vacuum container an active (or atomic state) gas consisting of either one of active hydrogen, active oxygen and active nitrogen with a partial pressure of $1 \times 10^{-3}$ Torr or less is produced. In an atmosphere of the active (or atomic state) gas, a film, which consists of a compound presenting semiconductor characteristics (CdS, CdSe, ZnSe, ZnS, ZnTe, CdTe) or a solid solution thereof and presents a desired polarity property such as p, n, p$^+$ or n$^+$, is vapor-deposited on a substrate at a desired position with a desired thickness, so as to fabricate an evaporation device which is preferable, for example, as a photoconductive target for a television camera tube.

10 Claims, 7 Drawing Figures

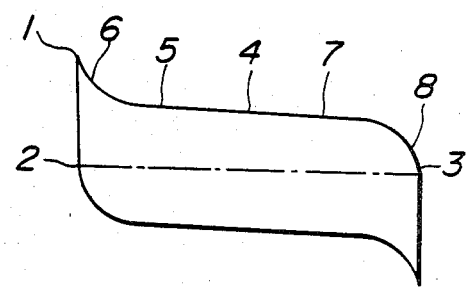
FIG_1A
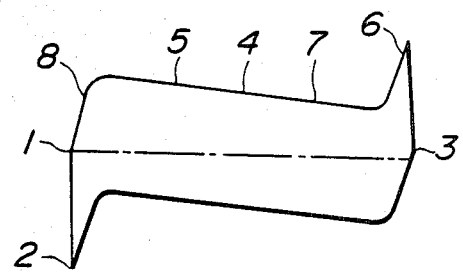
FIG_1B
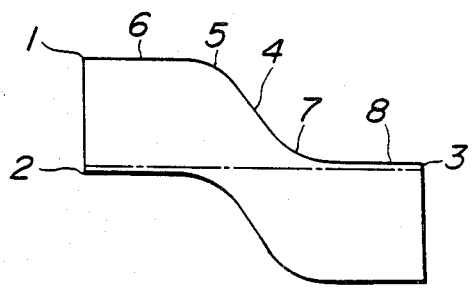
FIG_1C

EVAPORATION DEVICE

This is a Division of application Ser. No. 213,016 filed Dec. 4, 1980 now U.S. Pat. No. 4,352,834.

BACKGROUND OF THE INVENTION

The present invention relates to a method and an apparatus for fabricating an evaporation device having semiconductor characteristics in an active (or atomic state) gas atmosphere.

In case that an evaporation device of this kind, for example, a photoconductive target for a television camera tube, which is formed by a hetero-junction of material such as CdS or CdTe consisting of compounds having elements in IIb and VIb groups of the periodic table, is fabricated by an ordinary high vacuum deposition method, the surface of a film thus fabricated has better uniformity and graininess and higher mass productivity than a target film fabricated by other well-known deposition methods, for instance, a vapor phase reaction method or sputtering method. However, such characteristics as dark current, resolution, residual image and image burning are remarkably inferior.

The reasons for the above will first be described from a viewpoint of crystallography.

(1) A target film fabricated by an ordinary high vacuum deposition method has a structure in the form that fine crystals are deposited on a substrate. Individual crystal has a size, namely, a grain size (G.S.) of less than 300 Å at most. Accordingly, many grain boundaries (G.B.) lie between those fine crystals forming the target film, so that the transfer of signal charges are prevented. This results in the residual image and the image burning frequently.

(2) Segregated component atoms which do not grow up yet to a semiconductor compound, for instance, Te atoms in CdTe or Cd atoms in CdS, which will be referred to as deposits, hereinafter, exist on the grain boundaries. These deposits consist of metal or semimetal. Accordingly, the inner parts of the deposited film are shortcircuited by these deposits, so that an electric resistance is extremely reduced in a direction perpendicular to the film surface, namely, in the thickness direction and in a direction parallel to the film surface, namely, in the surface direction. As a result, the resolution and dark current characteristics are remarkably deteriorated.

(3) The above-mentioned deposits prevent remarkably the growth of the fine crystals. As a result, the above-mentioned grain size is reduced, and the above-mentioned grain boundaries are increased.

In order to remove those disadvantages of the high vacuum deposition method, various compensating procedures have been attempted as follows.

(a) The substrate temperature is increased during evaporation.

(b) After the evaporation, the recrystallization is processed in a vacuum or an inert gas, so as to increase the grain size.

(c) After the fabrication of the target film, the target film and powder consisting of at least one of component elements forming the semiconductor compound for the fabrication of the target film are together contained in an airtight silica ampoule or the like to be heated at a high temperature. Usually, the saturated vapor pressure of the powder is higher than that of the target film, so that the powder penetrates into the inner portion of the target film in a gaseous condition, and then reacts with the deposits to be converted to the semiconductor compound.

(d) The inner parts of the target film is prevented from shortcircuiting by heating the target film in an atmosphere of oxygen or air so as to convert the deposits to oxides.

One of such the method is described in detail in "Crystallinity and Electronic Properties of Evaporated CdS Films", by J. Dresner et al., Journal of Applied Physics, Vol. 34, No. 8, August 1963, pp 2390–2395.

However, these conventional methods have in common a disadvantage that the fabrication process of the target is considerably complicated. Besides, in the above methods (a) and (b), the deposited film is easily separated due to the difference of expansion coefficient between the film surface and the glass substrate, so that the temperature cannot be increased and as a result, the increase of the grain size due to the recrystallization can hardly be expected.

On the other hand, the above methods (c) and (d) have disadvantages in that it is difficult to convert the deposits which locate in deep portions in the film from the surface thereof to a semiconductor compound completely, and that the non-uniformity or film separation occur frequently.

As mentioned above, the semiconductor compounds of groups IIb and VIb fabricated by the conventional high vacuum deposition method has various disadvantages even from the viewpoint of crystallography.

In addition, in the case where a photoconductive target of p-n junction type is fabricated by this method, there exist serious disadvantages from the viewpoint of energy level of the p-n junction, as follows.

Generally speaking, as a p-n junction which is preferable to a photoconductive target, the most preferable is a structure of "$p^+$-p-i-n-$n^+$" having a wide region of a p-i-n polarities and a narrow $p^+$ region and a narrow $n^+$ region which are overlayed on the both surfaces of the wide p-i-n region, respectively, as described later. Here, the p-i-n region has a p-type and an n-type semiconductor regions formed respectively on both sides of an intrinsic semiconductor, namely, an i-type region in which a Fermi level exists between a conduction band and a full band. The $n^+$ region, in which a Fermi level exists in the vicinity of the conduction band, has a strong n-polarity. Similarly, the $p^+$ region, in which a Fermi level exists in the vicinity of the full band, has a strong p-polarity.

In order to form the above-mentioned wide p-i-n region, it is required that a Fermi level exists as close as possible to the i-region in each of the p-region and the n-region. That is, it is required from a viewpoint of crystallography to reduce lattice defects as few as possible.

The photoconductive target is operated by applying a negative voltage to the $p^+$ region and a positive voltage to the $n^+$ region. Usually, the $n^+$ region is in the form of a hole block, so that it has a structure of electron injection type. On the other hand, the $p^+$ region is in the form of an electron block, so that it has a structure of hole injection type. Accordingly, even if the voltage applied across the $p^+$ and $n^+$ regions of the target is increased under this condition, electrons and holes are not injected from both sides, so that a dark current is extremely reduced. However, if the polarities of this structure are reversed due to contact potentials between the $p^+$ and $n^+$ regions and signal electrodes and contamination by a residual gas or the like (namely, the polarities are changed to n+-p-i-n-p+), electrons and holes are injected into the film from the left side and the right side thereof, respectively, so that the dark current is increased extremely.

On the other hand, in the case where the regions of p+ and n+ are wide and the p-i-n region is narrow, the dark current itself is small. The p+ and n+ regions, however, act as electrode for applying an electrical field to the p-i-n region, and an electrical field for collecting photo-excited charges is not applied to the p-i-n region. Consequently, if the p+ and n+ regions are wide, the loss caused by an optical absorption is increased. That is to say, an amount of light arriving at the p-i-n region having a narrow photorensitive portion is reduced, and in addition the width of the p-i-n region is narrow or thin, so that the light arriving at the p-i-n region passes therethrough, and then disappears due to the absorption in the p+ and n+ regions. For these reasons, the loss of photo-electric conversion is increased extremely as a whole, so that the p+-p-i-n-n+ structure can be the most preferable. These facts are well-known and are described in detail, for example, in "Photoconductive Properties of Lead-Oxide Layers", by L. Heijne, Philips Research Report, 1960, pp 1, 4, 5, 8, 9, 14, 15, 20, 21, 80–83, 106, 107, 148–151, or in "Concepts in Photoconductivity and Allied Problems", by Albert Rose, published by Interscience Publishers, 1963.

As apparent from the above-mentioned structures, in order to obtain an excellent photoconductive target formed by compounds of groups IIb and VIb, a new evaporation technique is required so that a semiconductor film having a desired thickness with desired semiconductor polarities is deposited on a desired position, i.e., at a desired depth from a surface of a film structure.

However, the evaporation technique as mentioned above has not been realized in a conventional high vacuum deposition method in case of p or n material of IIb and VIb compounds. According to the conventional method, a deposited film itself of IIb and VIb compounds show p+ or n+ polarity. If deposition material is p material, p+ film is obtained and in case of n material, n+ film is obtained. Consequently, a junction having the structure of n+-p-i-n-p+ is apt to be fabricated. Were it possible to convert p+ or n+ film to p or n film by thermal treatment, it was still difficult to form a thin p+ or n+ region on an extremely narrow surface of those films. For instance, even if it is possible to convert a p region to p+ region by injecting an adequate impurity into the surface in accordance with an ion implantation method at each time of deposition or at each step of a deposition process, this conversion is not practical because of the complicated steps of the process.

Consequently, it is inevitably required that the polarity of a deposited film consisting of IIb and VIb compounds is controlled freely so that any desired polarity such as $p^{30}$, p, n, n+ or the like with a desired thickness during the deposition process.

SUMMARY OF THE INVENTION

An object of the present invention is to provide a method of fabricating an evaporation device in which the above-mentioned disadvantages of the conventional method are removed to process a deposition of p material and/or n material in an active gas.

Another object of the present invention is to provide a method for fabricatng an evaporation device presenting semiconductor characteristics by a simple fabrication process without the necessity of heat treatment or the like after the evaporation and with a good yield.

Still another object of the present invention is to provide an apparatus for fabricating an evaporation device presenting semiconductor characteristics in which the above-described disadvantages are deleted.

Still further object of the present invention is to provide an evaporation device fabricating apparatus from which toxic gases are exhausted after being made innoxious.

Still further object of the present invention is to provide an apparatus for fabricating an evaporation device having a long life.

Yet still further object of the present invention is to provide an apparatus for fabricating an evaporation device with lessened non-uniformity of deposited film.

In order to attain these various objects, a method for fabricating an evaporation device according to the present invention has features that a film consisting of a compound presenting a semiconductor characteristics or a solid solution thereof is deposited on a substrate in an atmosphere of an active (or atomic state) gas consisting of either one of active hydrogen, active oxygen and active nitrogen with a partial pressure of $1 \times 10^{-3}$ Torr or less in a vacuum container.

In a preferred embodiment of a fabrication method according to the present invention, either one of hydrogen gas, oxygen gas and nitrogen gas is introduced to the vacuum container with a pressure of 1 Torr or less, and a current of 0.01 mA to 1 mA is conducted in the vacuum container by a high speed electron beam accelerated by an accelerating voltage of 500 V to 3,000 V, so that the introduced gas is converted to the active (or atomic state) gas, the pressure of the introduced gas containing the active (or atomic state) gas is adjusted to be $1 \times 10^{-3}$ Torr or less, and then the film consisting of a compound presenting the semiconductor characteristics or the solid solution thereof is deposited on the substrate in the introduced gas containing the active gas.

Here, it is preferable that the compound presenting the semiconductor characteristics or the solid solution thereof has a hetero junction between groups IIb and VIb in the periodic table, and it is also preferable that the hetero junction between groups IIb and VIb is formed by either one of CdS, CdSe, ZnSe, ZnS, ZnTe and CdTe and a solid solution thereof.

According to the present invention, the deposited film can be formed by either one of CdTe and ZnTe and a solution thereof and the active (or atomic state) gas can be formed by active hydrogen so as to form a film presenting p-type semiconductor characteristics in which a Fermi level exists in the vicinity of a center of a forbidden band, and besides, the deposited film can be also formed by either one of CdTe and ZnTe and a solid solution thereof and the active gas can be also formed by active oxygen so as to form a film presenting a p+ type semiconductor characteristics in which a Fermi level exists in the vicinity of a full band.

Further, the deposited film can be formed by either one of CdS, CdSe, ZnS and ZnSe and a solid solution thereof and the active gas can be formed by active oxygen so as to form a film presenting n-type semiconductor characteristics in which a Fermi level exists in the vicinity of a center of a forbidden band.

Moreover, the deposited film can be formed by either one of CdS, CdSe, ZnS and ZnSe and a solid solution thereof and the active gas can be formed by active hydrogen so as to form a film presenting n+ type semiconductor characteristics in which a Fermi level exists in the vicinity of a conduction band.

In addition, the film presenting the semiconductor characteristics may be deposited on a substrate at least in the order of from "p" to "n" or from "n" to "p", or the film presenting the semiconductor characteristics may be deposited also on a substrate at least in the order of "p"-"n"-"p" or "n"-"p"-"n".

In an apparatus for fabricating an evaporation device in which a film consisting of a compound presenting semiconductor characteristics or a solid solution thereof is deposited on a substrate in an atmosphere of an active (or atomic state) gas formed by either one of hydrogen gas, oxygen gas and nitrogen gas, an apparatus according to the present invention comprises a vacuum container having a gas introduction path for introducing either one of hydrogen gas, oxygen gas and nitrogen gas to the vacuum container and a gas exhaust path connected to a gas exhausting equipment for controlling a gas pressure and a vacuum condition in the vacuum container, a discharging means disposed in the vacuum container and having a cathode with a heating power source and an anode to which a d.c. voltage is applied with respect to the cathode for producing the active (or atomic state) gas by activating either one of the gases by a discharge between the cathode and the anode, an evaporation source disposed in the vacuum container to accommodate evaporation material and having an evaporation heater for heating the evaporation material, a hot wall disposed in the vacuum container and having a hollow cylindrical body having a lower end opening for receiving a vapor evaporated from the evaporation source, an upper end opening being opposite to the lower end opening in a direction apart from the evaporation source, and an inner surface at least on which a resistive film is deposited so that the resistive film is heated by an electric power supplied across both ends of the resistive film, and a substrate mounting member for mounting a substrate on the upper end opening of the hot wall on which the vapor evaporated from the evaporation source is deposited so as to form the evaporation device.

Here, it is preferable that the anode and the cathode are arranged in a manner that an electron beam emitted by the discharging means is prevented from contacting the vapor evaporated from the evaporation source. It is also preferable to provide a shielding plate for shielding an electron beam emitted by the discharging means so as to prevent the electron beam from contacting the vapor evaporated from the evaporation source.

Further, it is also preferable that the hot wall has a first cylinder made of glass or ceramic and second cylinders and having each a diameter which is smaller than a diameter of the first cylinder. A substrate holder is provided on one end of the second cylinder so as to hold an evaporation substrate. A resistive film is deposited on the outer surfaces of the first and second cylinders. Lead wires are wound respectively around the second cylinders, so that a current flows through the lead wires to heat the resistive film. As a result, a temperature gradient is produced inside the first and second cylinders in accordance with the difference of diameters between the first and second cylinders.

In a preferred embodiment of the present invention, the resistive film may be deposited on the inner surfaces of the first and second cylinders so as to prevent an electrification of the inner surfaces of the first and second cylinders.

In a preferred embodiment of the apparatus according to the present invention, an oil diffusion pump is provided in the gas exhaust path, and in a downstream of the pump there is provided an exhaust equipment having an exhaust box in which an oil rotary pump is accommodated. A small holes are provided in a lower part of the exhaust box and an exhausting duct is connected to an upper end of the exhaust box. Another end of the exhausting duct is immersed in a caustic soda solution filled in a purifying bottle, which is sucked by a ventilator through a duct so that toxic gases exhausted from the oil rotary pump are absorbed by the caustic soda solution.

According to a further embodiment of the present invention, a distance between the anode and the cathode of the discharging means is determined to be 10-30 cm and the anode is formed of aluminium. A d.c. voltage of 500-3,000 V is applied to the anode and a discharge current of 0.01-1 mA is conducted for 5-30 minutes under a partial pressure of the introduced gas of 1 Torr or less.

It is preferable that an inner diameter of each of the second cylinders is longer by 10-80% than an inner diameter of the first cylinder and that the resistive film consists of a graphite film having a thickness of 0.05-0.5 mm and a resistivity of 100 $\Omega$-1 k$\Omega$. The evaporation substrate may consist of a glass substrate, which is heated at 200°-600° C. by supplying an electric power to the lead wires, so that a temperature at a side wall of the first cylinder becomes higher by 10°-20° C. than a temperature at the glass substrate.

In a preferred embodiment of the present invention, a valve member is provided in the gas exhaust path between the vacuum container and the oil diffusion pump and is controlled in such a way that an exhausting speed in the gas exhaust path is lowered during the evaporation deposition to prevent the active (or atomic state) gas from being exhausted from the oil diffusion pump. In addition, a degree of vacuum in the gas exhaust path between the oil diffusion pump and the oil rotary pump may preferably be at 0.01-0.05 Torr during the evaporation deposition.

The present invention will be described in detail hereinafter with reference to the accompanied drawings, in which:

BRIEF DESCRIPTION OF THE DRAWINGS

FIGS. 1A, 1B and 1C are level diagrams illustrating energy levels of various photoconductive targets;

DETAILED DESCRIPTION OF THE PREFERRED EMBODIMENTS

Figure 2:
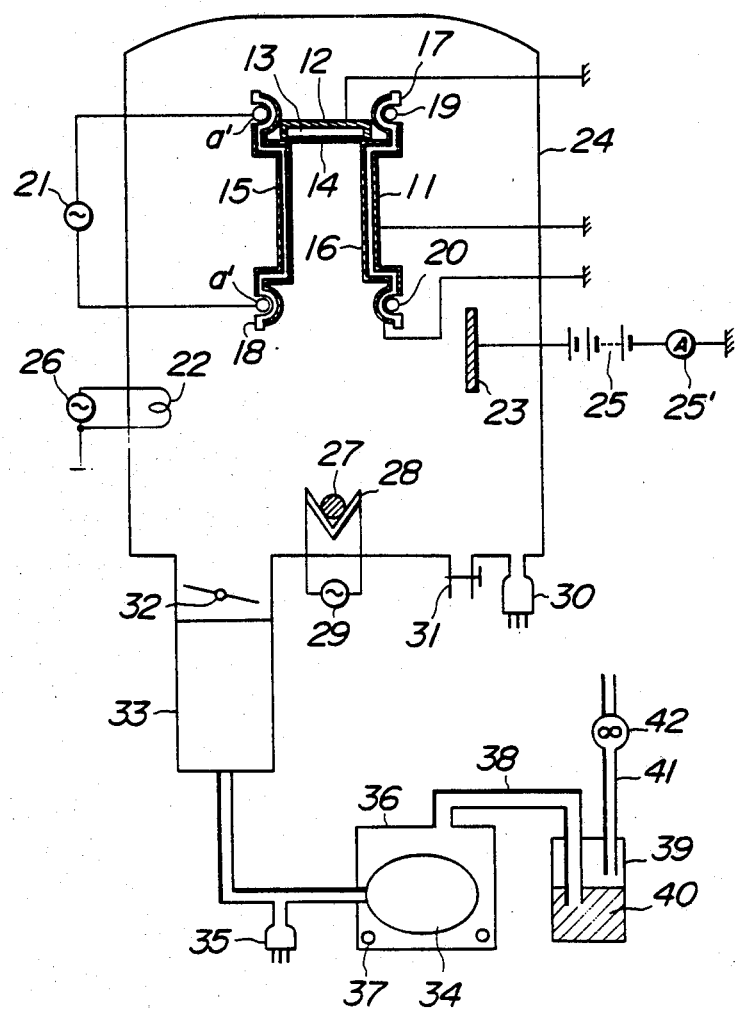
FIG. 2 is a schematic diagram showing an embodiment of the construction of an evaporation apparatus for embodying a method according to the present invention.

When a photoconductive target of pn junction type is fabricated by a conventional high vacuum deposition method, the above-described disadvantages are found from a viewpoint of energy level of pn junction. Those disadvantages will be explained first by referring to FIGS. 1A, 1B and 1C.

FIGS. 1A, 1B and 1C show pn junctions in a target film which are favorable and unfavorable from a viewpoint of energy level for photoconductive target. The energy level of a pn junction favorable to a photoconductive target is shown in FIG. 1A, and the energy levels of pn junctions unfavorable for photoconductive target are shown in FIGS. 1B and 1C.

First of all, an energy level diagram shown in FIG. 1A will be explained. For the sake of simplicity, it is assumed in those figures that a difference between a conduction band 1 and a full band 2, that is, a width of a so-called forbidden band is the same in various deposition material. A range where a Fermi level 3 exists between the conduction band 1 and the full band 2 in FIG. 1A, that is, a left side region of an intrinsic semiconductor or a so-called i-region 4 is assumed to be formed by material which is to be converted to a p-type semiconductor by high vacuum deposition. More specifically, this region corresponds to an energy level of a film formed of CdTe, ZnTe or a solid solution thereof, which will be referred to as p-material, hereinafter. Similarly, a right side region of the i-region 4 is assumed to be formed by another material which is to be converted to an n-type semiconductor by high vacuum deposition. More specifically, this region corresponds to an energy level of a film formed of CdS, CdSe, ZnS, ZnSe or a solid solution thereof, which will be referred to as n-material, hereinafter.

In FIG. 1A, a p-region 5 consisting of p-type semiconductor on the left side of the i-region 4 is wide and the left end portion of the p-region 5 is connected to a $p^+$ region 6 presenting a polarity of $p^+$. Here, "$p^+$" indicates a condition where a Fermi level 3 exists in the vicinity of the full band 2. On the other hand, an n-region 7 consisting of n-type semiconductor on the right side of the i-region 4 is wide and the right end portion of the n-region 7 is connected to a narrow $n^+$ region 8 presenting a polarity of $n^+$. That is to say, FIG. 1A shows a semiconductor structure in which a wide region having a width of 1-10 μm usually and presenting a p-i-n polarity exists between a narrow $p^+$ region and a narrow $n^+$ region. This structure will be referred to as $p^+$-p-i-n-$n^+$, hereinafter.

In order to form the above-mentioned wide p-i-n region, it is required that the Fermi level 3 exists as close as possible to the i-region 4 in each of the p-region 5 and the n-region 7. That is, it is required from a viewpoint of crystallography to reduce lattice defects as few as possible.

The photoconductive target is operated by applying a negative voltage to the $p^+$ region 6 and a positive voltage to the $n^+$ region 8. Usually, the $n^+$ region 8 is in the form of a hole block, so that it has a structure of electron injection type. On the other hand, the $p^+$ region 6 is in the form of an electron block, so that it has a structure of hole injection type. Accordingly, even if the voltage applied across the $p^+$ region 6 and the $n^+$ region 8 is increased under this condition, electrons and holes are not injected from both sides, so that a dark current is extremely reduced. However, if the polarities of this structure are reversed due to contact potentials between the $p^+$ region 6 and the $n^+$ region 8 and signal electrodes (not shown) and contamination by a residual gas or the like, as shown in FIG. 1B (namely, the polarities are changed to $n^+$-p-i-n-$p^+$), electrons and holes are injected into the film from the left side and the right side thereof, respectively, so that the dark current is increased extremely.

On the other hand, in the case where the $p^+$ regions and the $n^+$ regions are wide and the p-i-n region is narrow, as shown in FIG. 1C, the dark current itself is small. The $p^+$ and $n^+$ regions, however, act as electrodes for applying an electrical field to the p-i-n region, and an electric field for collecting photoexcited charges is not applied to the p-i-n region. Consequently, if the $p^+$ and $n^+$ regions are wide, the loss caused by an optical absorption is increased. That is to say, an amount of light arriving at the p-i-n region having a narrow photosensitive portion is reduced, and in addition the width of the p-i-n region is narrow or thin, so that the light arriving at the p-i-n region passes therethrough, and then disappears due to the absorption in the $p^+$ and $n^+$ regions. For these reasons, the loss of photo-electric conversion is increased extremely as a whole, so that the $p^+$-p-i-n-$n^+$ structure shown in FIG. 1A can be the most preferable.

As apparent from the above-mentioned structures, in order to obtain an excellent photoconductive target formed by compounds of groups IIb and VIb, a new evaporation technique is required so that a semiconductor film having a desired thickness with desired semiconductor polarities is deposited on a desired position, i.e., at a desired depth from a surface of a film structure.

However, the evaporation technique as mentioned above has not been realized in a conventional high vacuum deposition method in case of p or n material of IIb and VIb compounds. According to the conventional method, a deposited film itself of IIb and VIb compounds show $p^+$ or $n^+$ polarity. If deposition material is p material, a $p^+$ film is obtained and in case of n material, an $n^+$ film is obtained. Consequently, a junction having the structure of $n^+$-p-i-n-$p^+$, as shown in FIG. 1B is apt to be fabricated. Were it possible to convert $p^+$ or $n^+$ film to p or n film by thermal treatment, it was still difficult to form a thin $p^+$ or $n^+$ region on an extremely narrow surface of these films. For instance, even if it is possible to convert a p region to $p^+$ region by injecting an adequate impurity into the surface in accordance with an ion injection method at each time of deposition or at each step of a deposition process, this conversion is not practical because of the complicated steps of the process.

Consequently, it is inevitably required that the polarity of a deposited film consisting of IIb and VIb compounds is controlled freely to obtain any desired polarity such as $p^+$, p, n, $n^+$ or the like with a desired thickness during the deposition process.

According to the present invention, in order to satisfy the above-mentioned requirements, an evaporation device is fabricated in such a manner that a deposited film can be controlled arbitrarily to obtain any desired polarity such as $p^+$, p, n, $n^+$ or the like with a desired thickness during the evaporation process.

The present invention will be explained in detail hereinafter with reference to the drawings.

FIG. 2 shows an embodiment of a detailed construction of an evaporation apparatus for fabricating a photoconductive target according to a fabrication method of the present invention. In FIG. 2, 11 denotes a hot wall made of silica, pyrex or ceramics. A substrate holder 12 made of stainless steel or the like is disposed on an upper part of the hot wall 11. A glass substrate 13 is inserted into the substrate holder 12. A transparent conductive electrode 14 for deriving a signal current from the glass substrate 13 is coated to a surface thereof. A carbon film 15 for heating the hot wall 11 is deposited on an outer surface of the hot wall 11 in a conventional manner. In addition, according to the present invention, an antistatic carbon film 16 is deposited on the inner surface of the hot wall 11 to unify the evaporation by preventing the electrification of the hot wall 11 and to further improve the quality of the evaporation device. Further, it is necessary that one end of the transparent electrode 14 is electrically grounded through the substrate holder 12 and that one ends of the carbon films 15 and 16 deposited respectively on the outer and inner surfaces of the hot wall 11 are also grounded electrically.

The carbon films 15 and 16 are deposited on the outer and inner surfaces of the hot wall 11 made of pyrex or the like by the following process.

For example, outer and inner surfaces of a cylinder which has a wall of about 0.8 mm in thickness and an inner diameter of about 40 mm and which consists of silica, pyrex glass, ceramics or the like are roughened by sand blast, and then graphite solution is coated to those surfaces. Graphite films thus formed has preferably a thickness of 0.05-0.5 mm. Subsequently, those surfaces are calcined at a temperature of 400°-600° C. in an electric furnace in which a nitrogen ($N_2$) gas is blowing at an atmospheric pressure. As a result of the evaporation of solvents from those graphite solution films, uniform carbon films are formed on the inner and outer surfaces. The carbon film has a resistivity of 100Ω–1 kΩ.

Additional cylinders 17 and 18, each having an inner diameter larger by 10-80% than that of the hot wall 11 are connected respectively to both of upper and lower ends of the cylinder for the hot wall 11 having an inner diameter of 40 mm. These cylinders 17 and 18 are provided with recesses on outer surfaces thereof, and copper wires 19 and 20 are wound in those recesses 17 and 18 respectively and are connected commonly to the carbon film 15. The carbon film 15 desposited on the outer surface of the hot wall 11 is used as a heater heated by supplying an a.c. or d.c. electric power from an external power source 21. The carbon film 16 on the inner surface of the hot wall 11 is grounded as mentioned above for antistatic purpose. Further, when those carbon films 15 and 16 are arranged inversely, and the carbon film 15 on the outer surface is grounded and the electric power is supplied to the carbon film 16 on the inner surface, the non-uniformity of evaporation is apt to be produced by $H^+$ ions due to an electric field across both ends of the carbon film heater 16 on the inner surface, as will be described later. The glass substrate 13 can be heated at a temperature of about 200°-600° C. by the hot wall 11 in a manner that a temperature of the substrate 13 is higher by about 10°-20° C. than that of the inner surface of the hot wall 11.

In the above-mentioned construction, when the thicknesses of the carbon films 15 and 16 are uniform, the resistances of the upper and lower end portions of the hot wall 11 are lower than that of the central cylindrical portion thereof, so that the temperature of the glass substrate 13 is always lower by 10°-20° C. than that of the central portion. By providing this temperature difference a vapor which is injected into the central portion of the inner surface 16 of the hot wall 11 and reflected therefrom moves towards the glass substrate 13 maintained at a lower temperature. As a result, the growth rate of the target film is increased, so that a workability of remarkably enhanced.

A filament 22 for emitting thermions is disposed under the hot wall 11. One end of the filament 22 is grounded. A d.c. high voltage of 500-3,000 V is applicable between the filament 22 and an anode 23 formed of alminium or the like from the outside of a vacuum container 24 by an external power source 25. The numeral 25' denotes an om meter. The polarity of the above high voltage is set to "+" on the side of the anode 23 and to "−" on the side of the filament 22. The filament 22 is connected to an external a.c. or d.c. power source 26, so that electrons can be emitted from the filament 22 by heating. Evaporation material 27 and an evaporating heater 28 are disposed under the anode 23. The evaporating heater 28 is connected to an external a.c. or d.c. power source 29.

Figure 3:
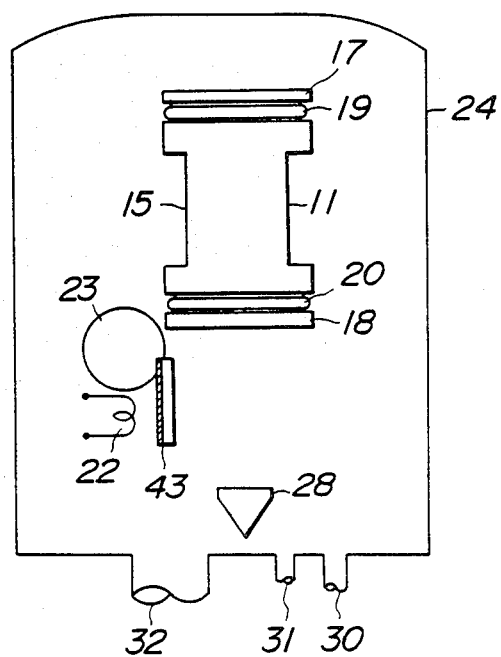
FIG. 3 is a schematic diagram showing another embodiment of an evaporation apparatus for embodying a method according to the present invention in part.

The geometrical relationship between the anode 23 and the filament 22 is so determined that a high speed electron beam emitted from the filament 22 does not contact the vapor evaporated from the evaporation material 27. If desired, a shielding plate 43 for interrupting a part of the high speed electron beam is disposed in the vicinity of at least either one of the filament 22 and the anode 23, as shown in FIG. 3, so as to facilitate such a deposition in an active (or atomic state) gas as will be described hereinafter.

Among the above-mentioned parts 11 to 28, the parts 11 to 20, 22, 23, 27 and 28, other than the various power sources 21, 25, 26 and 29, are disposed within the vacuum container 24. A vacuum meter 30 is provided in the lower end of the vacuum container 24 so as to monitor a pressure of a gas introduced into the container 24 which will be mentioned hereinafter. A gas introducing valve 31 is also provided in the lower end of the vacuum container 24 so as to introduce an oxygen gas or a hydrogen gas into the container 24. The vacuum container or bell jar 24 is connected to an oil diffusion pump 33 through a main valve 32. An exhaust pipe of the oil diffusion pump 33 is connected to an oil rotary pump 34. a low vacuum gauge 35, for instance, a Pirani vacuum gauge, a thermistor or the like is connected between the oil diffusion pump 33 and the oil rotary pump 34, so that a degree of subsidiary vacuum of the oil diffusion pump 33 is monitored by this low vacuum gauge 35 so as to adjust the main valve 32 during the introduction of gases which will be described later. The whole of the oil rotary pump 34 is enclosed by an exhausting box 36 made of duralumim or non-corrosion aluminium. Small holes 37, for instance, five or six holes having a diameter of 10 mm are opened in the lower portion of the exhausting box 36. The upper end of the exhausting box 36 is connected to a purifying bottle 39 made of glass through an exhausting duct 38. A caustic soda solution 40 is contained in the purifying bottle 39 and the exhausting duct 38 is connected to the bottle 39 in such a way that the exhausting duct 38 is immersed in the caustic soda solution 40. A second exhausting duct 41 is connected to the upper end of the purifying box 39 so that a gas introduced therein is exhausted outdoors by sucking action of a ventilating fan 42 or the like. Even if the subsidiary vacuum is equal to or lower than $10^{-1}$ Torr and accordingly gases are hardly exhausted by the oil rotary pump 34, a negative pressure is applied to the exhausting box 36 by the ventilating fan 42 so as to suck an external gas through the small holes 37.

Subsequently, a fabrication method of the present invention will be described in detail in a case where the above-described evaporation apparatus is employed to fabricate a evaporation film of IIb and VIb compounds in an active gas.

Prior to evaporation, heating elements of the evaporating apparatus shown in FIG. 2, that is, the hot wall 11, the evaporation source 27 and 28 and so on are heated in advance so as to sufficiently degas those elements. It is also required to minimize an atmosphere leakage of the vacuum container 24 so as to maintain an atmospheric pressure of $1 \times 10^{-5}$ Torr for 10 minutes or more while the main valve 32 is closed and to adjust the vacuum so as to minimize the gas discharge from the vacuum container 24.

This requirement plays an extremely important role in order to prevent the deterioration of gas purity during the deposition in the active (or atomic state) gas according to the present invention.

The hydrogen ($H_2$) gas having a partial pressure of $10^{-3}$ Torr or less is introduced into the vacuum container 24 evacuated to a high vacuum of $1 \times 10^{-6}$ Torr or less through the gas introduction valve 31. Then, the filament 22 is heated to emit the electron beam therefrom towards the anode 23. Preferably, the voltage applied to the anode 23 is in the order of 500–3,000 V, and the current flowing into the anode 23 is about 0.01–1 mA and the most preferably 0.03 mA. It is preferable that the current flows for about 5–30 minutes. The electron beam emitted from the filament 22 collides with the $H_2$ gas on the way to the anode 23 so as to convert $H_2$ molecules to H atoms. A conversion rate varies substantially from 5% to 50% depending upon the pressure in the vacuum container 24 and the current flowing time. It is also preferable to set a distance between the filament 22 and the anode 23 at about 10–30 cm in order that the electron beam effectively collides with the introduced gas.

If a p-material consisting of CdTe, ZnTe or a solid solution thereof is subject to the deposition as the evaporation material 27 in the atmosphere consisting of H atoms produced in a manner mentioned above referred to as an active hydrogen, hereinafter, a deposited film of CdTe having an extremely excellent crystal property is obtained. If active hydrogen is employed, the Te deposit obtained from the p-material reacts strongly with the active hydrogen produced during the deposition of the film, so that the deposit is converted to a hydrogen compound, for instance, $H_2Te$. This hydrogen compound is immediately vaporized because of its extremely high vacuum pressure, and evaporated from the deposited film into the vacuum container 24. Accordingly, the deposited film thus obtained from the p-material does not contain at all a deposit of Te atoms in contrast with a deposited film fabricated by a conventional high vacuum evaporation, so that the growth of crystal is accelerated to increase a grain size remarkably. In the case of p-material, the grain size is almost the same as the thickness of the deposited film. The crystallographic axis "111" is arranged substantially perpendicular to the glass substrate.

Figure 4A:
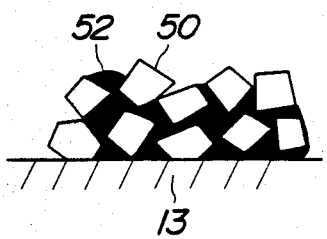
FIGS. 4A and 4B are explanatory diagrams showing structures of deposited films fabricated by a conventional method and a method of the present invention in contrast, respectively.
Figure 4B:
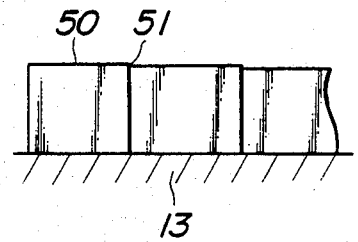

FIGS. 4A and 4B show the structural difference between target films consisting of CdTe which were fabricated respectively according to the prior method and a method of the present invention. In these drawings, 50 denotes a CdTe crystal, 51 denotes a grain boundary, and 52 denotes a deposit of Te.

In the conventional deposit film shown in FIG. 4A, the grain size of the CdTe crystal 50 is small, and the volume of the deposit 52 on the grain boundary is large. On the other hand, in the deposit film fabricated by a method according to the present invention, a grain boundary 51 cannot be found in a direction of film thickness and further the grain size of the CdTe crystal 50 is large, as well as the crystalline orientation thereof is uniform, as illustrated in FIG. 4B. The deposited film consisting of the p-material which is fabricated according to the present invention is in the form of p-type deposited film having a Fermi level substantially at the center of the forbidden band. This p-type film scarcely has lattice defects and particularly grain boundaries and deposits hardly exist, so that a film which is the most preferable to the film having a p-type region shown in FIG. 1A is obtained. Moreover, in most cases, the mobility in the direction of film thickness is the same as that of a single crystal, so that a residual image, an image burning or the like are not produced. Various methods may be employed to produce the above-mentioned active hydrogen. Prior to the evaporation, the partical pressure of the gas introduced through the gas introduction valve 31 is first set at about $1 \times 10^{-3}$ Torr while the main valve 32 is closed and then the high speed electron beam is flown for about 10 minutes. As a result, a large amount of active hydrogen is produced. After the vacuum container 24 is filled with the active hydrogen gas, the high velocity electron beam is interrupted and further the main valve 32 is opened slightly, to set the degree of vacuum in the vacuum container 24 at about $1 \times 10^{-3} - 5 \times 10^{-9}$ Torr. Then the temperature of the glass substrate 13 may be set at a temperature between the room temperature about 350° C. by heating the hot wall 11. Under this condition, the deposition of the p-material may be carried out.

Alternatively, the filament 22 and the anode 23 may be provided in an additional vacuum container disposed outside the vacuum container 24, so that the active hydrogen gas can be produced in a manner mentioned above in the additional vacuum container and then can be introduced into the vacuum container 24 through the gas introduction valve 31 or the like at the time of deposition. These evaporation methods have an advantage that the vapor from the evaporation source 27, 28 is scarcely ionized by the high speed electron beam, as will be mentioned hereinafter. However, active hydrogen is immediately converted to ordinary hydrogen again if the active hydrogen collides with each other or contacts a metal, so that it is required to pay careful attention to a manner of operation and the material quality of the gas introduction valve 31.

Furthermore, the deposition can be carried out in a different manner where, during the deposition, namely, during the formation of a deposited film, a hydrogen gas having a pressure of $1 \times 10^{-3}$ Torr or less is introduced, and an active hydrogen gas is continuously produced by flowing the high speed electron beam and further the pressure of hydrogen gas containing the active hydrogen is set $1 \times 10^{-3}$ Torr or less by adjusting the opening of the main valve 32. In this case where the active hydrogen is continuously produced, the vapor from the source 27, 28 is ionized by the high speed electron beam. As a result, the target film is apt to lack in uniformity. Thus, in order to produce active hydrogen, it is preferable to provide the anode 23 at a position where no p-material flys from the evaporation source 27, 28. On the other hand, when active hydrogen gas is produced by the high speed electron beam, $H^+$ ions are generated and deposited on the transparent electrode 14. Accordingly, if the transparent electrode 14 is not grounded, the deposit film frequently lacks in uniformity due to the electrification of the film. In view of this, it is desirable that the transparent electrode 14 and the carbon films 15 and 16 respectively on the outer and inner surfaces of the hot wall 11 are grounded as mentioned above.

In the case of producing active hydrogen by employing the above-mentioned various methods according to the present invention, a group of methods, where the partial pressure of the hydrogen gas containing active hydrogen is from $10 \times 10^{-4}$ Torr to $5 \times 10^{-4}$ Torr during the deposition, is referred to as "hard H method", while another group of methods, where the partial pressure is set $5 \times 10^{-4}$ Torr or less, is referred to as "soft H method", hereinafter.

In the above-mentioned operation, the main valve 32 is closed entirely or almost entirely and the exhaust speed is set as low as possible during the deposition so that active hydrogen is prevented from being evacuated by the oil diffusion pump 33 and that such toxic gases as $H_2Te$ gas generated by active hydrogen gas and $H_2Se$ gas or $H_2S$ gas generated when the n-material is used, as will be mentioned later, are prevented from being exhausted to the oil rotary pump 34 through the oil diffusion pump 33. It is preferable to regulate the closing of the main valve 32 while monitoring the subsidiary vacuum degree, which is usually set at 0.01-0.05 Torr, by the low vacuum gauge 35 arranged between the oil diffusion pump 33 and the oil rotary pump 34.

Further, even if those poisonous gases $H_2Te$, $H_2Se$, $H_2S$ are exhausted from the oil rotary pump 34, this exhaust itself is safe, since the exhausting box 36 to which a negative pressure is applied is provided to enclose the whole outside of the oil rotary pump 34, and further the upper end portion of the exhausting box 36 is connected to the purifying bottle 39 through the exhausting duct 38. Consequently, the exhausted toxic gases are absorbed by the caustic soda solution 40 in the purifying bottle 39, and, as a result, those poisonous gases are never evacuated towards the outside of the bottle 39. Accordingly, this exhausting apparatus is very safe from a viewpoint of operation.

While in the apparatus shown in FIG. 2, the small holes 37 are provided on the bottom wall of the exhausting box 36, if the holes 37 are not provided, the gases hardly flow in the purifying bottle 39 and therefore the purification of the gases does not work well, even if a strong negative pressure is applied to the exhausting box 36, since an amount of active hydrogen gas is extremely small. Thus, it is necessary to suck the external gas into the exhausting box 36 through the small holes 37.

While the hard H and soft H methods for the deposition of the p-material according to the present invention have been described, when the hydrogen gas introduced for the deposition in the atmosphere of active hydrogen is substituted for the oxygen gas, namely, $O_2$ gas, the $O_2$ gas is converted to O atoms, namely, active oxygen by the high speed electron beam. A deposition method in the atmosphere of active oxygen according to the present invention will be described hereinafter.

Like the soft H and hard H methods, a group of methods, where the partial pressure of the oxygen gas containing active oxygen is $5 \times 10^{-4}$ Torr or more during the deposition, is referred to as "hard O method," while another group of method, where the partial pressure is $5 \times 10^{-4}$ Torr or less is referred to as "soft O method".

Now, the deposition of the n-material, that is, CdS, CdSe, ZnSe, ZnS or a solid solution thereof in active oxygen will be described. Most of the deposits in films consisting of these materials are Cd or Zn. Active oxygen reacts strongly with Cd or Zn to form CdO or ZnO. In other words, Cd atoms or Zn atoms in metal condition, which shortcircuit the inner part of the film are converted respectively to semiconductor compound CdO or ZnO which has a higher resistance than metal. As a result, the film is converted to an n-type semiconductor film in which a Fermi level of the n-material exists in the vicinity of the center of the forbidden band. Namely, the film is converted to a film having a polarity such as shown in FIG. 1A. In this case, CdO and ZnO are not volatile unlike the case of active hydrogen and remain in the grain boundary. Accordingly, a grain size as in the case of n-material does not grow so remarkably as in the case of p-material. Any poisonous gas is not produced during the deposition in the atmosphere of active oxygen. However, it is required to close the main valve 32 securely so as to prevent the oxidation of the oil in the oil diffusion pump 33 due to the active (or atomic state) gas.

While in the foregoing advantageous effects obtained by the deposition of the p-material in the active hydrogen atmosphere and by the deposition of the n-material in the active oxygen atmosphere, advantageous effects obtained by the deposition of the p-material in the active oxygen atmosphere will be described.

In the deposition of the p-material, the most part of the deposit is Te atom and the deposit of Cd or Zn is scarcely found. However, active oxygen has an effect of selectively oxidizing Cd or Zn in a crystal, so that vacant holes of Cd or Zn are formed in the crystal. As a result, the polarity of the p-material is converted to a strong p-polarity, namely, p+ polarity. The degree of this conversion from "p" to "p+" is effected more strongly in the case of hard O method than in the case of soft O method.

On the other hand, in the deposition of the n-material in the active hydrogen atmosphere, such an effect that Se atoms or S atoms existing in the semiconductor compound consisting of n-material are converted to hydrogen compounds, so that vacant holes of Se or S are formed in the crystal. As a result, a semiconductor film having n+ polarity can be fabricated.

While in the foregoing the deposition method of the n-material and the p-material in the atmosphere of active hydrogen or active oxygen and the method of controlling a polarity of a deposited film has been described, a process of fabricating a photoconductive target having such energy levels as shown in FIG. 1A will be described hereinafter.

It is assumed that films are deposited on a surface of a transparent electrode in the order of $n^+ \rightarrow n \rightarrow i \rightarrow p \rightarrow p^+$ to fabricate a target for an ordinary low speed scanning (referred to as LP target, hereinafter).

In this deposition method, it is preferable to set the lower limit of the temperature at about 250° C., and to employ CdSe, CdS, ZnS, ZnSe or a solid solution thereof as n-material and to employ CdTe, ZnTe or a solid solution thereof as p-material. In this example, CdS is employed as n-material and CdTe is employed as p-material. In this case, it is preferable to deposit CdS to form an n+ layer according to the soft H method. After the soft H method, in order to form an n layer by depositing CdS according to the soft O method, it is required that the previous deposition process is once stopped prior to this deposition to open the main valve 32 so that the residual gas in the vacuum container 24 is reduced to obtain a high vacuum of $1\times10^{-6}$ Torr or less and thereafter the oxygen gas is again introduced into the vacuum container 24 through the gas introduction valve 31.

After the $n^+$-n film is formed in a manner mentioned above, CdTe is deposited on this film according to the soft H method to form a p-layer thereon. In this film, an i-layer is formed between the p-layer and the $n^+$-n layer to form an $n^+$-n-i-p film, as is well known. Then, CdTe is deposited on the resultant film according to the soft O method to form a film having $p^+$ polarity on the $n^+$-n-i-p film. Further, if the deposition is firstly effected according to the soft O method and then the employed method is shifted from "soft O" to "hard O" gradually, it is possible to obtain a structure in which an energy level changes gradually between the p-region and the $p^+$-region.

In case of a target scanned by a high speed electron beam having a negative polarity, a negative voltage is applied to a signal electrode and a positive voltage is applied to a beam scanning side, so that polarities of the target relating to "p" and "n" is reversed in comparison with that of an ordinary LP target. The target of this kind (referred to as "HN target" hereinafter) may be fabricated by depositing p- and n-material in a reversed order in comparison with the deposition for the LP target. More specifically, the deposition may be carried out in such an order as the transparent electrode, CdTe (soft O method), CdTe (soft H method), CdS (soft O method) and CdS (soft H method).

While in the above explanation, a fabrication method according to the present invention has been described with respect to the cases where active hydrogen and active oxygen are employed, the introduced gas may be nitrogen ($N_2$). The nitrogen gas may be converted to active (or atomic state) gas consisting of N atoms. If, in the atmosphere containing this active gas, the n-material CdS, CdSe, ZnS, ZnSe or a solid solution thereof is deposited, with a vacuum degree of $1\times10^{-3}$ Torr or less, effects which are substantially similar to those obtained in the case of the deposition of the n-material in the atmosphere of active oxygen are obtained, and an extremely excellent n-type semiconductor film is fabricated.

As is apparent from the foregoing, according to the present invention, a Fermi level or polarities of p, $p^+$, n, $n^+$ or the like of p- and n-material are controlled in a desired manner during the evaporation by the deposition in the atmosphere of the active (or atomic state) gas such as active hydrogen, active oxygen or active nitrogen, so that a deposit film consisting of a compound or a solid solution thereof and presenting semiconductor characteristics is formed with a desired thickness at a desired portion.

As a result, a target film is easily fabricated which has a more excellent crystalline property, less lattice defects and a more ideal structure of energy level "$p^+ \rightarrow p \rightarrow i \rightarrow n \rightarrow n^+$" in comparison with those of a deposit film fabricated by an ordinary high vacuum deposition method, so that a target having a little dark current, an excellent resolution and besides no residual images and no image burning is obtained.

Moreover, an order of deposition of respective layers can be determined in a desired sequence, for example, "$p^+ \rightarrow p \rightarrow i \rightarrow n \rightarrow n^+$" or "$n^+ \rightarrow n \rightarrow i \rightarrow p \rightarrow p^+$". As a result, either of LP and HN targets can be easily fabricated. In addition, according to the present invention, the fabrication process is extremely simple, so that any after process such as heat treatment after the deposition is not required. Consequently, a yield for product is remarkably improved. Further, according to the present invention, the advantages of an ordinary high vacuum deposition method, that is, a mass productivity and a good uniformity of a deposited film having no graininess are maintained.

Further, according to the present invention, an exhausting box having small holes is connected through an exhausting duct to a purifying bottle filled with caustic soda solution, to which a negative pressure is applied by a ventillating fan, so that toxic gases such as $H_2S$, $H_2Se$, $H_2Te$ are evacuated after they are made innoxious, so that the safety for operators is secured.

Furthermore, according to the present invention, in the deposition process in the atmosphere of the active gas, a hot wall which is coated with carbon films as shown in FIG. 2 is employed, so that a life of the heater formed by these carbon films is remarkably extended, since the reaction of these carbon films with active hydrogen, active oxygen or active nitrogen is more reduced in the case of this hot wall than in the case of an ordinary metallic heater. While a lifetime of the ordinary metallic heater is about a week, a lifetime of the heater in the form of hot wall in the present invention is longer than one half year.

In addition, a hot wall used in the present invention has an advantage that a glass substrate has less non-uniformity of temperature, even if the glass substrate is mounted eccentrically. For example, even if a position at which the substrate is mounted is deviated by $\pm 5$ mm, a temperature difference remain within 1° C. On the other hand, when the ordinary metallic heater is employed, in addition to the shortened lifetime due to the reaction with the active gas, a deposited film is frequently nonuniform due to electrification, since insulation parts cannot help being exposed inside and outside of the heater. On the contrary, a hot wall according to the present invention does not have portions which cause a problem of electrification except the edge of the upper end of the hot wall, so that the hot wall does not substantially cause the non-uniformity of the deposited film. Moreover, while the thickness of carbon films on the hot wall is uniform, the temperature difference between the glass substrate and the central portion of the cylindrical hot wall can be easily varied by changing the diameter of the cylindrical hot wall.

While in the above explanation, an evaporation device fabricated by a method according to the present invention is used as a target having a structure of "$p^+$-p-i-$n^+$", the present invention is not limited to the fabrication of target and the present invention can be effectively applied, as a matter of course, to various uses other than the fabrication of a target, for example, the fabrication of various devices such as pnp or npn phototransistor device, TFT, solar battery and so on.

What is claimed is:

1. An apparatus wherein a film consisting of a compound presenting a semiconductor characteristics or a solid solution thereof is deposited on a substrate in an atmosphere of an atomic state gas selected from a group consisting of hydrogen gas, oxygen gas and nitrogen gas with a partial pressure of $1\times10^{-3}$ Torr or less said apparatus comprising:

a vacuum container having a gas introduction path for introducing a gas selected from a group consisting of hydrogen gas, oxygen gas and nitrogen gas to said vacuum container and a gas exhaust path connected to a gas exhausting equipment for controlling a gas pressure and a vacuum condition in said vacuum container, a discharging means disposed in said vacuum container and having a cathode with a heating power source and an anode to which a voltage is applied with respect to said cathode for producing said atomic state gas by activating said gas by a discharge between said cathode and said anode, an evaporation source disposed in said vacuum container for accommodating evaporation material and having an evaporation heater for heating said evaporation material, a hot wall disposed in said vacuum container and having a hollow cylindrical body having a lower end opening for receiving a vapor evaporated from said evaporation source, an upper end opening being opposite to said lower end opening in a direction apart from said evaporation source, and an inner surface at least on which a resistive film is deposited so that the resistive film is heated by an electric power supplied across both ends of said resistive film, and a substrate mounting member for mounting said substrate on said upper end opening of said hot wall on which said vapor evaporated from said evaporation source is deposited.

2. The apparatus as claimed in claim 1, wherein said anode and said cathode are arranged in a manner that an electron beam emitted by said discharging means is prevented from contacting said vapor evaporated from said evaporation source.

3. The apparatus an evaporation as claimed in claim 1, wherein said discharging means has a shielding plate for shielding an electron beam emitted by said discharging means so as to prevent said electron beam from contacting said vapor evaporated from said evaporation source.

4. The apparatus an evaporation as claimed in claim 1, wherein said hot wall has a first cylinder made of glass or ceramic and second cylinders connected to both edges of said first cylinder, respectively and each having a diameter which is smaller than a diameter of said first cylinder, a base holder being provided on one end of said second cylinder so as to hold an evaporation substrate, a resistive film being deposited on the outer surfaces of said first and second cylinders, and lead wires being wound respectively around said second cylinders, so that a current flows through said lead wires to heat said resistive film, whereby a temperature gradient being produced inside said first and second cylinders in accordance with the difference of diameters between said first and second cylinders.

5. The apparatus an evaporation as claimed in claim 1, wherein a resistive film is deposited on said inner surfaces of said first and second cylinders so as to prevent an electrification of said inner surfaces of said first and second cylinders.

6. The apparatus an evaporation as claimed in claim 1, wherein an oil diffusion pump is provided in said gas exhaust path, and in a downstream of said oil diffusion pump there is provided an exhaust equipment having an exhaust box in which an oil rotary pump is accommodated, and small holes are provided in a lower part of said exhaust box, to an upper end of which is connected an exhausting duct, another end of which is immersed in a caustic soda solution filled in a purifying bottle, which is sucked by a ventilator through a second duct, so that toxic gases exhausted from said oil rotary pump are absorbed by said caustic soda solution.

7. The apparatus an evaporation as claimed in claim 1, wherein, said anode is formed of aluminium, a distance between said anode and said cathode of said discharging means is determined in a range from 10 cm to 30 cm, a d.c. voltage in a range from 500 V to 3,000 V is applied to said anode and a discharge current in a range from 0.01 mA to 1 mA is conducted for a time duration in a range from 5 minutes to 30 minutes under a partial pressure of the introduced gas of 1 Torr or less.

8. The apparatus an evaporation as claimed in claim 4, wherein an inner diameter of each of said second cylinders is longer by an amount in a range from 10% to 80% than an inner diameter of said first cylinder, said resistive film consists of a graphite film having a thickness in a range from 0.05 mm to 0.5 mm and a resistivity in a range from 100Ω to 1 kΩ, and said evaporation substrate consists of a glass substrate such is heated at a temperature in a range from 200° C. to 600° C. by supplying an electric power to said lead wires, so that a temperature at a side wall of said first cylinder becomes higher by a temperature in a range from 10° C. to 20° C. than a temperature at said glass substrate.

9. The apparatus an evaporation as claimed in claim 6, wherein a valve member is provided in said gas exhaust path between said vacuum container and said oil diffusion pump and is controlled in such a way that an exhausting speed in said gas exhaust path is lowered during the evaporation deposition to prevent said active gas from being exhausted from said oil diffusion pump.

10. The apparatus an evaporation as claimed in claim 9, wherein a degree of vacuum in said gas exhaust path between said oil diffusion pump and said oil rotary pump is set at a pressure in a range from 0.01 Torr to 0.05 Torr during the evaporation deposition.

* * * * *